(12) United States Patent
Huang et al.

(10) Patent No.: US 11,404,675 B2
(45) Date of Patent: Aug. 2, 2022

(54) LIGHT EMITTING DEVICE INCLUDING LIGHT COUPLING SUB-LAYERS HAVING A STACKED STEP STRUCTURE, AND MANUFACTURING METHOD THEREOF

(71) Applicants: Chongqing BOE Display Technology Co., Ltd., Chongqing (CN); BOE TECHNOLOGY GROUP CO., LTD., Beijing (CN)

(72) Inventors: Can Huang, Beijing (CN); Dawei Shi, Beijing (CN); Weilin Lai, Beijing (CN); Jiandong Bao, Beijing (CN); Lu Yang, Beijing (CN); Wentao Wang, Beijing (CN); Liji Cheng, Beijing (CN)

(73) Assignees: Chongqing Boe Display Technology Co., Ltd., Chongqing (CN); Boe Technology Group Co., Ltd., Beijing (CN)

( * ) Notice: Subject to any disclaimer, the term of this patent is extended or adjusted under 35 U.S.C. 154(b) by 202 days.

(21) Appl. No.: 16/879,554

(22) Filed: May 20, 2020

(65) Prior Publication Data

US 2021/0111377 A1   Apr. 15, 2021

(30) Foreign Application Priority Data

Oct. 14, 2019 (CN) .......................... 201910974036.2

(51) Int. Cl.
*H01L 51/52* (2006.01)
*H01L 27/32* (2006.01)
*H01L 51/56* (2006.01)

(52) U.S. Cl.
CPC ...... *H01L 51/5275* (2013.01); *H01L 27/3213* (2013.01); *H01L 51/56* (2013.01)

(58) Field of Classification Search
CPC .. H01L 51/5275; H01L 51/56; H01L 27/3213
(Continued)

(56) References Cited

U.S. PATENT DOCUMENTS

2011/0068357 A1   3/2011  Kitamura
2012/0307191 A1*  12/2012  Park .................... G02B 5/0236
                                                        349/144
(Continued)

FOREIGN PATENT DOCUMENTS

CN    102809846 A    12/2012
CN    103262649 A    8/2013
(Continued)

OTHER PUBLICATIONS

First Office Action dated Jun. 22, 2021 for application No. CN201910974036.2 with English translation attached.

*Primary Examiner* — Matthew E. Gordon
(74) *Attorney, Agent, or Firm* — Nath, Goldberg & Meyer; Joshua B. Goldberg (57) ABSTRACT

The present disclosure provides a light emitting device and a manufacturing method thereof, a display panel and a display apparatus. The light emitting device includes a substrate; a light emitting element on the substrate; and a light coupling layer on a light emitting side of the light emitting element, wherein a thickness of the light coupling layer gradually decreases in a direction from a central region of the light emitting device toward an edge region of the light emitting device.

15 Claims, 5 Drawing Sheets

(58) Field of Classification Search
USPC .......................................................... 257/40
See application file for complete search history.

(56) References Cited

U.S. PATENT DOCUMENTS

2013/0277703 A1* 10/2013 Matsuzaki .............. H01L 33/58
257/98
2020/0110277 A1* 4/2020 Miyasaka .............. G01B 11/25

FOREIGN PATENT DOCUMENTS

| CN | 104319351 A | 1/2015 |
| CN | 105850228 A | 8/2016 |

* cited by examiner

LIGHT EMITTING DEVICE INCLUDING LIGHT COUPLING SUB-LAYERS HAVING A STACKED STEP STRUCTURE, AND MANUFACTURING METHOD THEREOF

CROSS REFERENCE TO RELATED APPLICATION

The present disclosure claims priority from a Chinese patent application No. 201910974036.2, filed on Oct. 14, 2019 to National Intellectual Property Administration, PRC, the disclosure of which is incorporated herein by reference in its entirety.

TECHNICAL FIELD

The present disclosure belongs to the technical field of display, and particularly relates to a light emitting device and a manufacturing method thereof, a display panel and a display apparatus.

BACKGROUND

With the development of display technology, organic light emitting diode (OLED) panels are increasingly used in various fields, such as mobile devices, smart wearing, vehicle systems, television screens, etc., due to their characteristics of self-illumination, high contrast, and flexibility. With the development of the OLED panels, requirements on performances of the OLED panels are higher and higher in market.

SUMMARY

An aspect of the present disclosure provides a light emitting device including a substrate; a light emitting element on the substrate; and a light coupling layer on a light emitting side of the light emitting element, wherein a thickness of the light coupling layer gradually decreases in a direction from a central region of the light emitting device toward an edge region of the light emitting device.

According to an embodiment of the present disclosure, the light coupling layer includes a plurality of light coupling sub-layers stacked to form a step structure.

According to an embodiment of the present disclosure, a material of each of the plurality of light coupling sub-layers is the same.

According to an embodiment of the present disclosure, the plurality of light coupling sub-layers include a first light coupling sub-layer, a second light coupling sub-layer, and a third light coupling sub-layer, wherein, the first light coupling sub-layer is on a side, facing away from the substrate, of the light emitting element, the second light coupling sub-layer is on a side, facing away from the light emitting element, of the first light coupling sub-layer, and the third light coupling sub-layer is on a side, facing away from the first light coupling sub-layer, of the second light coupling sub-layer; and orthographic projections of centers of the first light coupling sub-layer, the second light coupling sub-layer and the third light coupling sub-layer on the substrate are overlapped, and in any direction parallel to the substrate, a length of the third light coupling sub-layer is smaller than a length of the second light coupling sub-layer, and the length of the second light coupling sub-layer is smaller than a length of the first light coupling sub-layer.

According to an embodiment of the present disclosure, a thickness $T_1$ of the first light coupling sub-layer, a thickness $T_2$ of the second light coupling sub-layer and a thickness $T_3$ of the third light coupling sub-layer satisfy:

$$(T_1 + T_2 + T_3) = \frac{(T_1 + T_2)}{\cos\alpha} = \frac{T_1}{\cos\beta}$$

where $\alpha$ is an angle by which a first viewing angle is tilted relative to a front viewing angle, and light emitted by the light emitting device at the first viewing angle only passes through the first light coupling sub-layer and the second light coupling sub-layer; $\beta$ is an angle by which a second viewing angle is tilted relative to the front viewing angle, light emitted by the light emitting device at the second viewing angle only passes through the first light coupling sub-layer, and $\beta > \alpha$.

According to an embodiment of the present disclosure, in any direction parallel to the substrate, a length $H_2$ of the second light coupling sub-layer is larger than or equal to $2 \times \tan\alpha \times (T_1 + T_2)$; and a length $H_1$ of the first light coupling sub-layer is larger than or equal to $2 \times \tan\beta \times T_1$.

According to an embodiment of the present disclosure, $\alpha=30°$, $\beta=60°$, and in any direction parallel to the substrate, a ratio of the length $H_1$ of the first light coupling sub-layer to the length $H_2$ of the second light coupling sub-layer is equal to or greater than 3.

According to an embodiment of the present disclosure, orthographic projections of the plurality of light coupling sub-layers on the substrate are rectangular.

According to an embodiment of the present disclosure, orthographic projections of the plurality of light coupling sub-layers on the substrate are circular.

According to an embodiment of the present disclosure, a surface of the light coupling layer facing away from the substrate is a curved surface.

According to an embodiment of the present disclosure, the curved surface has a constant curvature.

According to an embodiment of the present disclosure, the light emitting element includes a first electrode on the substrate; a light emitting layer on a side of the first electrode facing away from the substrate; and a second electrode on a side of the light emitting layer facing away from the first electrode.

According to an embodiment of the present disclosure, the light emitting layer includes a first color sub-pixel, a second color sub-pixel, and a third color sub-pixel, the first color sub-pixel includes a first color electron blocking layer and a first color light emitting layer, the second color sub-pixel includes a second color electron blocking layer and a second color light emitting layer, and the third color sub-pixel includes a third color electron blocking layer and a third color light emitting layer.

According to an embodiment of the present disclosure, the light emitting layer includes a red sub-pixel, a green sub-pixel, a blue sub-pixel, and a yellow sub-pixel.

According to an embodiment of the present disclosure, the light emitting device further includes a lithium fluoride layer on a side of the light coupling layer facing away from the substrate.

Another aspect of the present disclosure provides a manufacturing method of a light emitting device including providing a substrate; forming a light emitting element on the substrate; and forming a light coupling layer on a light emitting side of the light emitting element, so that a thickness of the light coupling layer gradually decreases in a direction from a central region of the light emitting device toward an edge region of the light emitting device.

According to an embodiment of the present disclosure, forming the light coupling layer on the light emitting side of the light emitting element includes sequentially evaporating light coupling sub-layers in the light coupling layer on the light emitting side of the light emitting element, such that the light coupling sub-layers are stacked to form a step structure.

According to an embodiment of the present disclosure, a surface of the light coupling layer facing away from the substrate is formed as a curved surface, and the curved surface has a constant curvature.

Another aspect of the present disclosure provides a display panel including the above light emitting device.

Another aspect of the present disclosure provides a display apparatus including the above display panel.

DETAILED DESCRIPTION

To make objects, technical solutions and advantages of the present disclosure more apparent, the present disclosure will be described in further detail with reference to the accompanying drawings, and it is apparent that the described embodiments are only some embodiments, not all embodiments, of the present disclosure. All other embodiments, which may be derived by a person skilled in the art from the embodiments disclosed herein without making any creative effort, shall fall within a protection scope of the present disclosure.

Shapes and sizes of components in the accompanying drawings do not reflect true scale, but are merely intended to facilitate an understanding of contents of the embodiments of the present disclosure.

An OLED panel includes a plurality of light emitting devices therein. By arranging a light coupling layer in the light emitting device, the light coupling layer can improve light emitting efficiency of the OLED panel by utilizing antireflection film principle. But the light coupling layer may result in differences in colors of a display panel.

Figure 1:
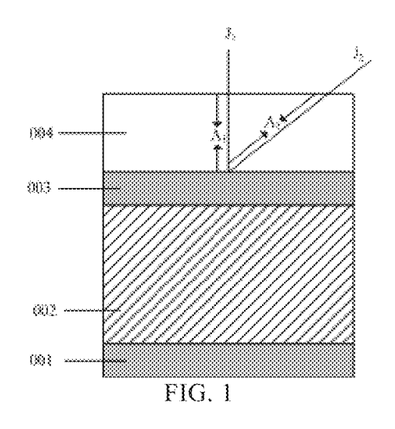
FIG. 1 is a schematic structural diagram of a light emitting device.

As shown in FIG. 1, a light emitting device includes an anode 001, a light emitting layer 002 on the anode 001, a cathode 003 on the light emitting layer 002, and a light coupling layer 004 disposed on the cathode 003. A structure of the light coupling layer 004 is a cuboid with a certain length and a certain thickness. When an OLED panel operates, light emitted from the light emitting layer 002 exits from the cathode 003 and then exits through the light coupling layer 004. Cases that a light ray J1 received by a display panel is observed from a front viewing angle and a light ray J2 received by the display panel is observed from a viewing angle tilted with respect to the front viewing angle are taken as an example. A light path A1 along which the light ray J1 goes from a lower surface of the light coupling layer 004 to an upper surface of the light coupling layer 004 is shorter than a light path A2 along which the light ray J2 goes from the lower surface of the light coupling layer 004 to the upper surface of the light coupling layer 004, i.e., there is a light path difference (A2−A1) between the light ray J1 and the light ray J2. Therefore, when the panel is viewed from different viewing angles, since light paths of light rays emitted at different angles in the light coupling layer 004 are different, colors of the display panel viewed from different viewing angles are different, that is, the display panel may have color deviation under different viewing angles, thereby affecting a display effect of the display panel.

Figure 2:
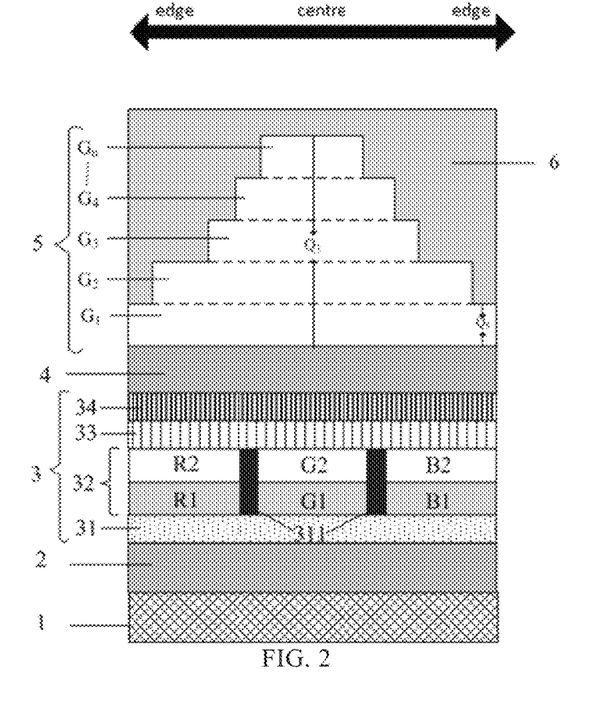
FIG. 2 is a schematic diagram of a structure (a step structure) of a light emitting device according to an embodiment of the present disclosure.
Figure 3:
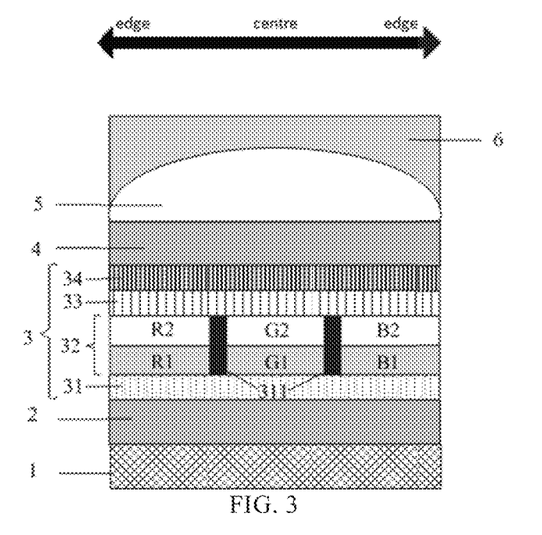
FIG. 3 is a schematic diagram of a structure (a spherical cap structure) of a light emitting device according to another embodiment of the present disclosure.

FIG. 2 is a schematic diagram of a structure (a step structure) of a light emitting device according to an embodiment of the present disclosure, and FIG. 3 is a schematic diagram of a structure (a spherical cap structure) of a light emitting device according to another embodiment of the present disclosure.

As shown in FIGS. 2 and 3, a light emitting device includes a substrate 1, and a second electrode 2, a light emitting layer 3, and a first electrode 4 which are sequentially disposed on the substrate 1. The second electrode 2, the light emitting layer 3, and the first electrode 4 constitute a light emitting element.

According to an embodiment of the present disclosure, the second electrode 2 is located on the substrate 1, the first electrode 4 is located on a side of the second electrode 2 facing away from the substrate 1, and the light emitting layer 3 is located between the first electrode 4 and the second electrode 2. On a light emitting side of the light emitting element, i.e. a side of the first electrode 4 facing away from the substrate 1, there is further provided a light coupling layer 5, and a thickness of the light coupling layer 5 gradually decreases in a direction from a central region of the light emitting device toward an edge region of the light emitting device. For example, in FIG. 2, the light coupling layer 5 has a step structure, and the thickness of the light coupling layer 5 gradually decreases from Q1 to Q5 in the direction from the central region of the light emitting device toward the edge region of the light emitting device.

It should be noted that light emitted by the light emitting layer 3 enters the first electrode 4 from a side of the first electrode 4 close to the light emitting layer 3, and then exits from a side of the first electrode 4 facing away from the light emitting layer 3, a light emitting side of the first electrode 4 is the side of the first electrode 4 facing away from the light emitting layer 3, and the light coupling layer 5 is disposed on the light emitting side of the first electrode 4, so that light emitted by the light emitting layer 3 enters the light coupling layer 5 after passing through the first electrode 4.

According to an embodiment of the disclosure, since the thickness of the light coupling layer 5 gradually decreases in the direction from the central region of the light emitting device toward the edge region of the light emitting device, lengths of the light paths of the light emitted at different angles in the light coupling layer 5 may be equal to each other, so that color deviation of the display panel observed at different viewing angles can be avoided, and a display effect of the display panel can be improved. Moreover, compared with a light coupling layer with a uniform thickness (for example, the light coupling layer shown in FIG. 1), the thickness of the light coupling layer 5 in the light emitting device according to the embodiment gradually decreases along the direction from the central region of the light emitting device toward the edge region of the light emitting device, so that an overall thickness of the light coupling layer 5 is decreased, and thus luminance attenuation of light emitted by the light emitting layer 3 when passing through the light coupling layer 5 can be reduced, and the display effect of the display panel can be further improved.

FIG. 2 illustrates an example in which the light emitting element is of a top emission type, but the present disclosure is not limited thereto, and the light emitting element may also be of a bottom emission type. In this case, the light emitting side of the light emitting element is a side of the second electrode 2 close to the substrate 1, and therefore, the light coupling layer 5 is disposed between the substrate 1 and the second electrode 2, that is, on the light emitting side of the light emitting element, and void resulting from a non-constant thickness of the light coupling layer 5 is filled with LiF 6.

According to an embodiment of the present disclosure, the first electrode 4 may be a transparent electrode (CTD) so that light may transmit through the first electrode 4.

According to an embodiment of the present disclosure, the light emitting layer 3 may include a red sub-pixel R, a green sub-pixel G, and a blue sub-pixel B, and alternatively, the light emitting layer 3 may include a red sub-pixel R, a green sub-pixel G, a blue sub-pixel B, and a yellow sub-pixel Y. Specific structure of the light emitting layer may be designed as needed, and is not limited herein.

According to an embodiment of the present disclosure, the light emitting layer 3 may include a hole transporting layer (HTL) 31 disposed on a side of the second electrode 2 facing away from the substrate 1, a sub-pixel layer 32 disposed on a side of the HTL 31 facing away from the substrate 1, a hole blocking layer (HBL) 33 disposed on a side of the sub-pixel layer 32 facing away from the substrate 1, and an electron transporting layer (ETL) 34 disposed on a side of the HBL 33 facing away from the substrate 1. The sub-pixel layer 32 may include a plurality of color sub-pixels arranged side by side, and pixel defining layers (PDLs) 311 are disposed between the color sub-pixels so that the respective color sub-pixels do not interfere with each other. Each color sub-pixel includes a color electron blocking layer and a color light emitting layer. By taking a case where the light emitting layer 3 includes three color sub-pixels (R, G, B-color sub-pixels) as an example, the R-color sub-pixel includes a R-color electron blocking layer (R-EBL) R1 disposed on the side of the HTL 31 facing away from the substrate 1 and a R-color light emitting layer (R-EML) R2 disposed on a side of the R-color electron blocking layer R1 facing away from the substrate 1; the G-color sub-pixel includes a G-color electron blocking layer (G-EBL) G1 disposed on the side of the HTL 31 facing away from the substrate 1 and a G-color light emitting layer (G-EML) G2 disposed on a side of the G-color electron blocking layer G1 facing away from the substrate; the B-color sub-pixel includes a B-color electron blocking layer (B-EBL) B1 disposed on the side of the HTL 31 facing away from the substrate 1 and a B-color light emitting layer (B-EML) B2 disposed on a side of the B-color electron blocking layer B1 facing away from the substrate 1.

Referring to FIG. 2, the light coupling layer 5 may have a step structure ($G_1$~$G_n$), and in the direction from the central region of the light emitting device toward the edge region of the light emitting device, the step structure has a gradually decreasing number of steps, i.e., the thickness of the light coupling layer 5 gradually decreases. For example, as shown in FIG. 2, the thickness of the light coupling layer 5 decreases gradually from Q1 to Q5.

Referring to FIG. 3, the light coupling layer 5 may have a sphere-like structure with a curved top surface (i.e., a surface of the light coupling layer 5 facing away from the substrate 1). Since the top surface of the light coupling layer 5 is a curved surface, a distance between a bottom surface of the light coupling layer 5 (i.e., a surface of the light coupling layer 5 close to the first electrode 4) and the top surface of the light coupling layer 5 gradually decreases, i.e., the thickness of the light coupling layer 5 gradually decreases, in the direction from the central region of the light emitting device toward the edge region of the light emitting device.

According to an embodiment of the present disclosure, a curvature of the entire top surface of the light coupling layer 5 may be constant such that the top surface of the light coupling layer 5 is presented as a hemispherical structure, that is, a center of the bottom surface of the light coupling layer 5 is equidistant from any point on the top surface.

The following description will be given in detail by taking a case that the light coupling layer 5 has the step structure as an example.

As shown in FIG. 2, the light coupling layer 5 includes a plurality of light coupling sub-layers, which are sequentially denoted as $G_1, G_2, \ldots G_n$, and the plurality of light coupling sub-layers $G_1$-$G_n$ are stacked to form the step structure. The number of the light coupling sub-layers $G_1$-$G_n$ is set according to the number of viewing angles at which the color deviation of the display panel needs to be eliminated. For example, if color deviation of the display panel observed at one viewing angle needs to be eliminated, the light coupling layer 5 may include two stacked light coupling sub-layers ($G_1, G_2$), if color deviation of the display panel observed at two viewing angles needs to be eliminated, the light coupling layer 5 may include three stacked light coupling sub-layers ($G_1, G_2, G_3$), and so on, and if color deviation of the display panel observed at N viewing angles needs to be eliminated, the light coupling layer may include (N+1) stacked light coupling sub-layers ($G1$~$G_{n+1}$). The step structure will be described below by way of example.

According to an embodiment of the present disclosure, the light coupling layer 5 may be formed of a multiphenyls organic small molecule material, for example, a benzene organic material, an anthracene organic material or a phenanthrene organic material, having a refractive index between 1.8 and 1.9, but the material of the light coupling layer 5 is not limited to the above materials, and any material that enables the light coupling layer 5 to its function may be used. In addition, materials of each of the light coupling sub-layers may be the same or different, and the following description will be given by taking the case that the material of each of the light coupling sub-layers is the same as an example.

Figure 4:
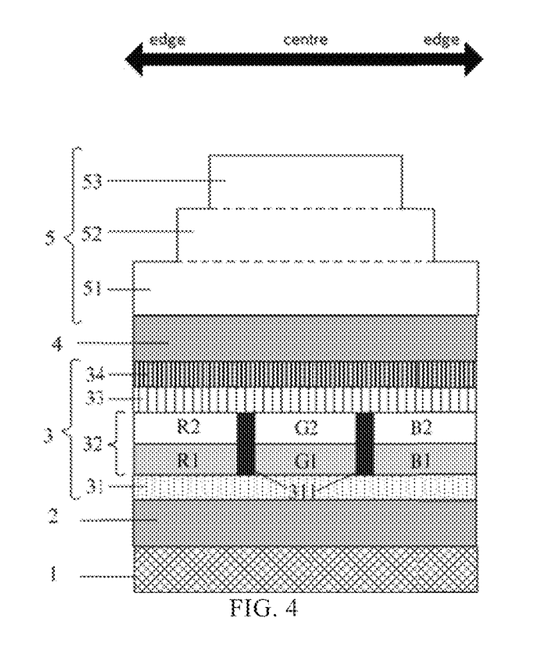
FIG. 4 is a schematic diagram of a structure (a three-layer step structure) of a light emitting device according to another embodiment of the present disclosure.
Figure 5:
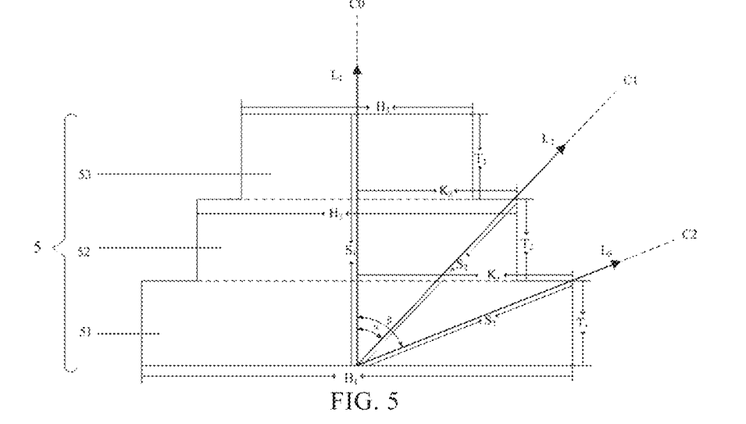
FIG. 5 is a schematic structural diagram of a light coupling layer according to an embodiment of the present disclosure.

FIG. 4 is a schematic diagram of a structure (a three-layer step structure) of a light emitting device according to another embodiment of the present disclosure, and FIG. 5 is a schematic structural diagram of a light coupling layer according to an embodiment of the present disclosure.

As shown in FIGS. 4 and 5, in order to eliminate color deviation generated when the display panel is observed from a first viewing angle C1 and a second viewing angle C2, the light coupling layer 5 may include three stacked light coupling sub-layers, which are a first light coupling sub-layer 51, a second light coupling sub-layer 52, and a third light coupling sub-layer 53, respectively.

It should be noted that, the first viewing angle C1 is a viewing angle for viewing the display panel at an angle α tilted with respect to a front viewing angle C0, and the second viewing angle C2 is a viewing angle for viewing the display panel at an angle β tilted with respect to the front viewing angle C0.

The first light coupling sub-layer 51 is located on the side of the first electrode 4 facing away from the light emitting layer 3, the second light coupling sub-layer 52 is located on a side of the first light coupling sub-layer 51 facing away from the first electrode 4, and the third light coupling sub-layer 53 is located on a side of the second light coupling sub-layer 52 facing away from the first light coupling sub-layer 51.

Figure 6:
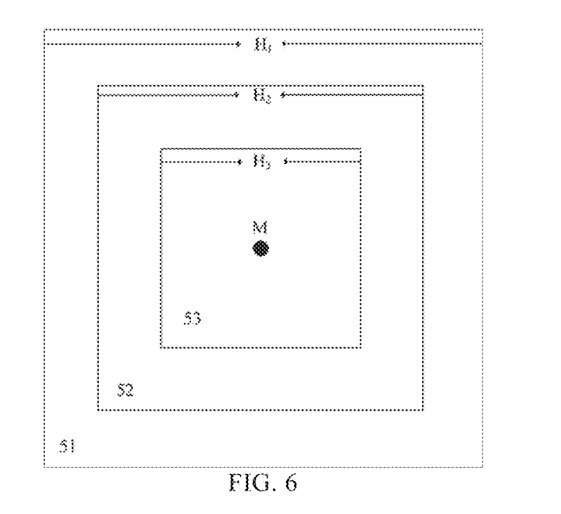
FIG. 6 is a top view of a light coupling layer according to an embodiment of the present disclosure.

FIG. 6 is a top view of the light coupling layer 5. Orthographic projections of centers of the first light coupling sub-layer 51, the second light coupling sub-layer 52 and the third light coupling sub-layer 53 on the substrate 1 are overlapped with each other (for example, an overlapped center is a center point M shown in FIG. 6), and in any direction parallel to the substrate 1, a length H of the third light coupling sub-layer 53 is smaller than a length $H_2$ of the second light coupling sub-layer 52, and the length $H_2$ of the second light coupling sub-layer 52 is smaller than a length $H_1$ of the first light coupling sub-layer 51, so that the first light coupling sub-layer 51, the second light coupling sub-layer 52 and the third light coupling sub-layer 53 are stacked to form the step structure, and the thickness of the light coupling layer 5 gradually decreases in the direction from the central region of the light emitting device toward the edge region of the light emitting device. That is, as shown in FIG. 5, in the direction from the central region of the light emitting device toward the edge region of the light emitting device, the thickness of the light coupling layer 5 decreases from a sum $(T_1+T_2+T_3)$ of thicknesses of the first light coupling sub-layer 51, the second light coupling sub-layer 52, and the third light coupling sub-layer 53, to a sum $(T_1+T_2)$ of thicknesses of the first light coupling sub-layer 51 and the second light coupling sub-layer 52, and further to thickness $T_1$ of the first light coupling sub-layer 51.

Referring to FIG. 5, a light ray $L_1$ emitted at the front viewing angle C0 exits after passing through the first light coupling sub-layer 51, the second light coupling sub-layer 52 and the third light coupling sub-layer 53, a light ray $L_2$ emitted at the first viewing angle C1 exits after passing through only the first light coupling sub-layer 51 and the second light coupling sub-layer 52, and a light ray $L_3$ emitted at the second viewing angle C2 exits after passing through only the first light coupling sub-layer 51, so that color deviation generated when the display panel is observed at the first viewing angle C1 and the second viewing angle C2 can be eliminated, and a light path $S_1$ of the light ray $L_1$ emitted at the front viewing angle C0 in the light coupling layer 5, a light path $S_2$ of the light ray $L_2$ emitted at the first viewing angle C1 in the light coupling layer 5, and a light path $S_2$ of the light ray $L_3$ emitted at the second viewing angle C2 in the light coupling layer 5 have a same length. In addition, after the thicknesses of the first light coupling sub-layer 51, the second light coupling sub-layer 52 and the third light coupling sub-layer 53 are determined, lengths of the first light coupling sub-layer 51, the second light coupling sub-layer 52 and the third light coupling sub-layer 53 also need to be determined.

Further, as shown in FIG. 5, if the light path $S_1$ of the light ray $L_1$ emitted at the front viewing angle C0 in the light coupling layer 5, the light path $S_2$ of the light ray $L_2$ emitted at the first viewing angle C1 in the light coupling layer 5, and the light path $S_3$ of the light ray $L_3$ emitted at the second viewing angle C2 in the light coupling layer 5 have the same length, and materials of the first light coupling sub-layer 51, the second light coupling sub-layer 52, and the third light coupling sub-layer 53 are the same (i.e. refractive indexes n are the same), thickness $T_1$ of the first light coupling sub-layer 51, thickness $T_2$ of the second light coupling sub-layer 52, and thickness $T_3$ of the third light coupling sub-layer 53 satisfy the following relation according to refractive index formula:

$$n(T_1 + T_2 + T_3) = \frac{n(T_1 + T_2)}{\cos\alpha} = \frac{nT_1}{\cos\beta}.$$

Namely, the following relation is satisfied:

$$(T_1 + T_2 + T_3) = \frac{(T_1 + T_2)}{\cos\alpha} = \frac{T_1}{\cos\beta},$$

where α is an angle by which the first viewing angle C1 is tilted relative to the front viewing angle C0, and the light ray $L_2$ emitted at the first viewing angle C1 from the light emitting device only passes through the first light coupling sub-layer 51 and the second light coupling sub-layer 52. β is an angle by which the second viewing angle C2 is tilted relative to the front viewing angle C0, the light ray $L_3$ emitted at the second viewing angle C2 from the light emitting device only passes through the first light coupling sub-layer 51, and β>α.

Further, as shown in FIG. 5, in the light emitting device according to the embodiment, if the light path $S_1$ of the light ray $L_1$ emitted at the front viewing angle C0 in the light coupling layer 5, the light path $S_2$ of the light ray $L_2$ emitted at the first viewing angle C1 in the light coupling layer 5, and the light path $S_3$ of the light ray $L_3$ emitted at the second viewing angle C2 in the light coupling layer 5 have the same length, according to the above relation among the thickness $T_1$ of the first light coupling sub-layer 51, the thickness $T_2$ of the second light coupling sub-layer 52, and the thickness $T_3$ of the third light coupling sub-layer 53 and tangent theorem, it can be known that, in any direction parallel to the substrate 1, one half $K_1$ of the minimum length of the first light coupling sub-layer 51 is equal to $(\tan\beta)\times T_1$, one half $K_2$ of the minimum length of the second light coupling sub-layer 52 is equal to $(\tan\alpha)\times(T_1+T_2)$, and as long as the length $H_1$ of the first light coupling sub-layer 51 is greater than $2\times K_1(H_1\geq 2\times(\tan\beta)\times T_1)$, the length $H_2$ of the second light coupling sub-layer 52 is greater than $2\times K_2(H_2\geq 2\times(\tan\alpha)\times(T_1+T_2))$, the length $H_1$ of the first light coupling sub-layer 51 is greater than the length $H_2$ of the second light coupling sub-layer 52, and the length $H_2$ of the second light coupling sub-layer 52 is greater than the length $H_3$ of the third light coupling sub-layer 53, among the light emitted from the light emitting layer 3, the light ray $L_1$ emitted at the front viewing angle C0 exits through the first light coupling sub-layer 51, the second light coupling sub-layer 52, and the third light coupling sub-layer 53, the light ray $L_2$ emitted at the first viewing angle C1 exits only through the first light coupling sub-layer 51 and the second light coupling sub-layer 52, and the light ray $L_3$ emitted at the second viewing angle C2 exits only through the first light coupling sub-layer 51.

According to the above example, assuming that the angle α by which the first viewing angle C1 is tilted relative to the front viewing angle C0 is 30°, the angle β by which the second viewing angle C2 is tilted relative to the front viewing angle C0 is 60°, and a total thickness of the light coupling layer 5 is 800 angstrom (Å), then according to $$(T_1 + T_2 + T_3) = \frac{(T_1 + T_2)}{\cos\alpha} = \frac{T_1}{\cos\beta},$$

it can be calculated that the thicknesses $T_1$ of the first light coupling sub-layer 51 is 400 Å, the thickness $T_2$ of the second light coupling sub-layer 52 is 293 Å, and the thickness $T_3$ of the third light coupling sub-layer 53 is 231 Å, and it can also be calculated that $K_1$=tan 60°×$T_1$=693 Å, $K_2$=tan 30°×($T_1$+$T_2$)=231 Å. Thus, $K_1$:$K_2$=3:1=3, that is, a ratio of the length $H_1$ of the first light coupling sub-layer 51 to the length $H_2$ of the second light coupling sub-layer 52 may be equal to or greater than 3.

Further, as shown in FIG. 5, in the light emitting device according to the embodiment, if the light emitting layer 3 is manufactured by using a fine metal mask (FMM) process, the length $H_1$ of the first light coupling sub-layer 51 may be determined according to size of an opening of the light emitting layer 3, and the length $H_1$ may be greater than or equal to the size of the opening of the light emitting layer 3. Then the length $H_3$ of the third light coupling sub-layer 53 is determined according to the size of the opening of the FFM, and the length $H_3$ is greater than or equal to the size of a minimum opening that can be achieved by the FFM process.

In summary, by stacking three light coupling sub-layers to form the step structure, and determining the length and the thickness of each light coupling sub-layer as described above, it is possible to make the light ray $L_1$ emitted at the front view angle C0 exit through the first light coupling sub-layer 51, the second light coupling sub-layer 52 and the third light coupling sub-layer 53, make the light ray $L_2$ emitted at the first viewing angle C1 exit through only the first light coupling sub-layer 51 and the second light coupling sub-layer 52, make the light ray $L_3$ emitted at the second viewing angle C2 exit through only the first light coupling sub-layer 51, and the light path $S_1$ of the light ray $L_1$ emitted at the front view angle C0 in the light coupling layer 5, the light path $S_2$ of the light ray $L_2$ emitted at the first viewing angle C1 in the light coupling layer 5, and the light path $S_3$ of the light ray $L_3$ emitted at the second viewing angle C2 in the light coupling layer 5 can have a same length, so that color deviation of the display panel observed at the first viewing angle C1 and the second viewing angle C2 can be avoided, thereby improving the display effect of the display panel. It should be noted that, if it is required to eliminate color deviation of the display panel at more viewing angles, the light coupling layer 5 may include more light coupling sub-layers, and the light coupling sub-layers are stacked to form the step structure. If the light coupling layer 5 includes a plurality of light coupling sub-layers, similarly, the thickness and the length of each light coupling sub-layer can be determined as described above. The number of the light coupling sub-layers in the light coupling layer 5 may be set as needed, and is not limited herein.

Figure 7:
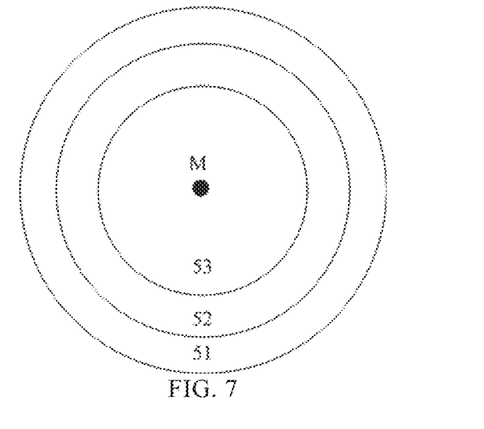
FIG. 7 is a top view of a light coupling layer according to another embodiment of the present disclosure.

According to an embodiment of the present disclosure, orthographic projections of the light coupling sub-layers on the substrate 1 may have various shapes, for example, may be rectangles as shown in FIG. 6, circles as shown in FIG. 7, or other shapes. The orthographic projections of the light coupling sub-layers on the substrate 1 can be designed as required, as long as the light coupling sub-layers can be stacked to form a step structure with a thickness gradually decreasing in the direction from the central region of the light emitting device toward the edge region of the light emitting device, and the present disclosure is not limited herein.

Referring back to FIGS. 2 and 3, the light emitting device may further include a lithium fluoride layer (LiF) 6 disposing on a side of the light coupling layer 5 facing away from the substrate 1, and the LiF 6 is used for refractive index matching for the light coupling layer 5 and insulating the light coupling layer 5 from water and oxygen to prevent the light coupling layer 5 from being corroded by water and oxygen.

Figure 8:
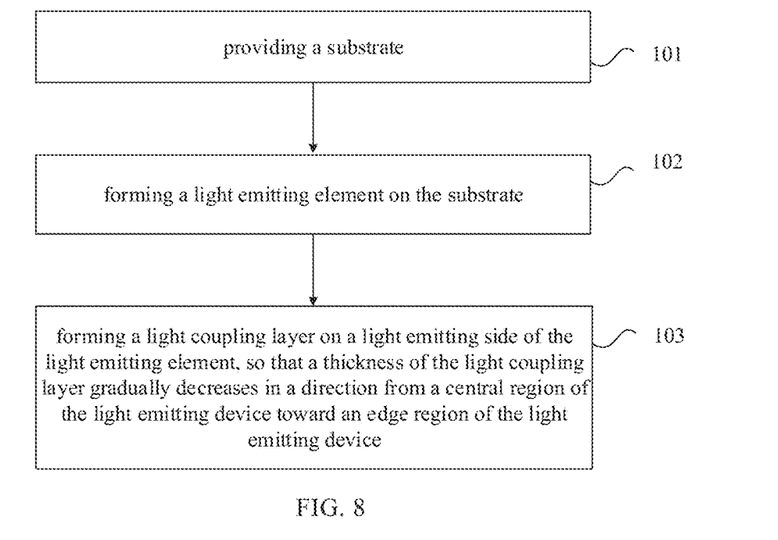
FIG. 8 is a flowchart of a manufacturing method for a light emitting device according to an embodiment of the present disclosure.

FIG. 8 is a flowchart of a manufacturing method of a light emitting device according to an embodiment of the present disclosure.

As shown in FIG. 8, the manufacturing method of a light emitting device according to an embodiment of the present disclosure includes steps 101 to 105.

In step 101, a substrate is provided.

According to an embodiment of the present disclosure, the substrate of the light emitting device may include a glass substrate, or other types of substrates, which may be designed as desired, and is not limited herein.

In step 102, a light emitting element is formed on the substrate.

According to an embodiment of the present disclosure, forming the light emitting element on the substrate may include forming a second electrode on the substrate; forming a light emitting layer on a side of the second electrode facing away from the substrate; and forming a first electrode on a side of the light emitting layer facing away from the second electrode.

According to an embodiment of the present disclosure, if the light emitting device is applied to a display panel, a thin film transistor driving circuit is further provided on the substrate, and the second electrode of the light emitting element is formed on the thin film transistor driving circuit. A material of the second electrode may be, for example, an organic material.

According to an embodiment of the present disclosure, forming the light emitting layer on the second electrode includes that sequentially evaporating organic material layers on the side of the second electrode facing away from the substrate, so as to form the light emitting layer. An HTL is evaporated on the side of the second electrode facing away from the substrate, a sub-pixel layer is evaporated on a side of the HTL facing away from the substrate, an HBL, is evaporated on a side of the sub-pixel layer facing away from the substrate, and an ETL is evaporated on a side of the HBL facing away from the substrate.

Further, evaporating the sub-pixel layer on the side of the HTL facing away from the substrate includes that sequentially evaporating color electron blocking layers (such as R, G, B color electron blocking layers) on the side of the HTL facing away from the substrate, and evaporating a corresponding color light emitting layer (such as R, G, B color light emitting layer) on a side of each color electron blocking layer facing away from the substrate. A PDL is formed between the color electron blocking layers and the color light emitting layers.

According to an embodiment of the present disclosure, the first electrode may be a transparent electrode (CTD) so that light emitted from the light emitting layer may transmit through the first electrode.

In step 103, a light coupling layer is formed on a light emitting side of the light emitting element such that a thickness of the light coupling layer gradually decreases in a direction from a central region of the light emitting device to an edge region of the light emitting device.

According to an embodiment of the present disclosure, forming the light coupling layer on the light emitting side of the light emitting element includes sequentially evaporating light coupling sub-layers in the light coupling layer on the side of the first electrode facing away from the light emitting layer, so that the light coupling sub-layers are stacked to form a step structure.

By taking the case that the light coupling layer includes three light coupling sub-layers as an example, sequentially evaporating light coupling sub-layers in the light coupling layer includes evaporating a first light coupling sub-layer by using an open mask, evaporating a second light coupling sub-layer by using a first FFM on a side of the first light coupling sub-layer facing away from the substrate, and evaporating a third light coupling sub-layer by using a second FFM on a side of the second light coupling sub-layer facing away from the substrate. An opening of the first FFM is larger than an opening of the second FFM. The shape of the opening of the open mask is set according to the length and shape of the first light coupling sub-layer, and shapes of the openings of the first FFM and the second FFM are respectively set according to lengths and shapes of the second light coupling sub-layer and the third light coupling sub-layer. Because the plurality of light coupling sub-layers in the light coupling layer are formed by the same material through evaporation, the light coupling layer can be manufactured in one chamber, and manufacturing processes of the light emitting device is simplified.

According to an embodiment of the present disclosure, the step 103 may be followed by step 104 of forming a LiF layer on the light coupling layer.

According to an embodiment of the present disclosure, the LiF layer is manufactured on the light coupling layer through evaporation so that the LiF performs refractive index matching for the light coupling layer, and the LiF can insulate the light coupling layer from water and oxygen to avoid the light coupling layer from being corroded by water and oxygen.

The present disclosure also provides a display panel including the above light emitting device. The display panel may include various types of display panels, which are not limited herein.

The present disclosure further provides a display apparatus including the display panel describe above. The display apparatus may be any product or component with a display function, such as a mobile phone, a tablet computer, a television, a display, a notebook computer, a digital photo frame, a navigator and the like. Other essential components of the display apparatus are provided as understood by those skilled in the art, are not described herein, nor should they be construed as limiting the present disclosure.

In the light emitting device according to the embodiments of the disclosure, because the thickness of the light coupling layer 5 gradually decreases in the direction from the central region of the light emitting device to the edge region of the light emitting device, the light paths of the light emitted at different angles in the light coupling layer 5 can have a same length, so that the color deviation of the display panel observed at different viewing angles can be avoided, and the display effect of the display panel can be improved. Moreover, compared with a light coupling layer with uniform thickness, the thickness of the light coupling layer 5 according to the embodiments of the disclosure gradually decreases in the direction from the central region of the light emitting device to the edge region of the light emitting device, so that the overall thickness of the light coupling layer 5 is decreased, the luminance attenuation of light emitted by the light emitting layer 3 through the light coupling layer 5 can be reduced, and the display effect of the display panel is further improved.

It will be understood that the above embodiments are merely exemplary embodiments employed to illustrate the principles of the present disclosure, and the present disclosure is not limited thereto. It will be apparent to those skilled in the art that various changes and modifications may be made therein without departing from spirit and scope of the present disclosure, and these changes and modifications are to be considered within the scope of the present disclosure.

The invention claimed is:

1. A light emitting device comprising:
a substrate;
a light emitting element on the substrate; and
a light coupling layer on a light emitting side of the light emitting element, wherein a thickness of the light coupling layer gradually decreases in a direction from a central region of the light emitting device toward an edge region of the light emitting device,
wherein the light coupling layer comprises a plurality of light coupling sub-layers stacked to form a step structure,
wherein the plurality of light coupling sub-layers comprise a first light coupling sub-layer, a second light coupling sub-layer, and a third light coupling sub-layer, the first light coupling sub-layer is on a side of the light emitting element facing away from the substrate, the second light coupling sub-layer is on a side of the first light coupling sub-layer facing away from the light emitting element, and the third light coupling sub-layer is on a side of the second light coupling sub-layer facing away from the first light coupling sub-layer, and orthographic projections of centers of the first light coupling sub-layer, the second light coupling sub-layer and the third light coupling sub-layer on the substrate are overlapped, and in any direction parallel to the substrate, a length of the third light coupling sub-layer is smaller than a length of the second light coupling sub-layer, and the length of the second light coupling sub-layer is smaller than a length of the first light coupling sub-layer,
wherein the light emitting element comprises: a first electrode on the substrate, a light emitting layer on a side of the first electrode facing away from the substrate, and a second electrode on a side of the light emitting layer facing away from the first electrode, and
wherein the light emitting layer comprises a first color sub-pixel, a second color sub-pixel, and a third color sub-pixel, the first color sub-pixel comprises a first color electron blocking layer and a first color light emitting layer, the second color sub-pixel comprises a second color electron blocking layer and a second color light emitting layer, and the third color sub-pixel comprises a third color electron blocking layer and a third color light emitting layer.

2. The light emitting device of claim 1, wherein a material of each of the plurality of light coupling sub-layers is the same.

3. The light emitting device of claim 1, wherein a thickness $T_1$ of the first light coupling sub-layer, a thickness $T_2$ of the second light coupling sub-layer and a thickness $T_3$ of the third light coupling sub-layer satisfy:

$$(T_1 + T_2 + T_3) = \frac{(T_1 + T_2)}{\cos\alpha} = \frac{T_1}{\cos\beta}$$

where $\alpha$ is an angle by which a first viewing angle is tilted relative to a front viewing angle, and light emitted by the light emitting device at the first viewing angle only passes through the first light coupling sub-layer and the second light coupling sub-layer; and $\beta$ is an angle by which a second viewing angle is tilted relative to the front viewing angle, light emitted by the light emitting device at the second viewing angle only passes through the first light coupling sub-layer, and $\beta > \alpha$.

4. The light emitting device of claim 3, wherein in any direction parallel to the substrate; a length $H_2$ of the second light coupling sub-layer is larger than or equal to $2 \times \tan \alpha \times (T_1 + T_2)$; and a length $H_1$ of the first light coupling sub-layer is larger than or equal to $2 \times \tan \beta \times T_1$.

5. The light emitting device of claim 4, wherein $\alpha = 30°$, $\beta = 60°$, and in any direction parallel to the substrate, a ratio of the length $H_1$ of the first light coupling sub-layer to the length $H_2$ of the second light coupling sub-layer is equal to or greater than 3.

6. The light emitting device of claim 1, wherein orthographic projections of the plurality of light coupling sub-layers on the substrate are rectangular.

7. The light emitting device of claim 1, wherein orthographic projections of the plurality of light coupling sub-layers on the substrate are circular.

8. The light emitting device of claim 7, wherein a surface of the light coupling layer facing away from the substrate is a curved surface.

9. The light emitting device of claim 8, wherein the curved surface has a constant curvature.

10. The light emitting device of claim 7, wherein the first color sub-pixel is a red sub-pixel, the second color sub-pixel is a green sub-pixel, and the third color sub-pixel is a blue sub-pixel.

11. The light emitting device of claim 9, further comprising a lithium fluoride layer on a side of the light coupling layer facing away from the substrate.

12. A display panel, comprising the light emitting device of claim 7.

13. A display apparatus, comprising the display panel of claim 12.

14. A manufacturing method of a light emitting device, comprising:
providing a substrate;
forming a light emitting element on the substrate; and
forming a light coupling layer on a light emitting side of the light emitting element, wherein a thickness of the light coupling layer gradually decreases in a direction from a central region of the light emitting device toward an edge region of the light emitting device,
wherein forming the light coupling layer on the light emitting side of the light emitting element comprises:
sequentially evaporating light coupling sub-layers in the light coupling layer on the light emitting side of the light emitting element, such that the light coupling sub-layers are stacked to form a step structure,
wherein the light coupling sub-layers comprise a first light coupling sub-layer, a second light coupling sub-layer, and a third light coupling sub-layer, the first light coupling sub-layer is on a side of the light emitting element facing away from the substrate, the second light coupling sub-layer is on a side of the first light coupling sub-layer facing away from the light emitting element, and the third light coupling sub-layer is on a side of the second light coupling sub-layer facing away from the first light coupling sub-layer, and orthographic projections of centers of the first light coupling sub-layer, the second light coupling sub-layer and the third light coupling sub-layer on the substrate are overlapped, and in any direction parallel to the substrate, a length of the third light coupling sub-layer is smaller than a length of the second light coupling sub-layer, and the length of the second light coupling sub-layer is smaller than a length of the first light coupling sub-layer,
wherein forming the light emitting element on the substrate comprises:
forming a first electrode on the substrate;
forming a light emitting layer on a side of the first electrode facing away from the substrate; and
forming a second electrode on a side of the light emitting layer facing away from the first electrode, and
wherein the light emitting layer comprises a first color sub-pixel, a second color sub-pixel, and a third color sub-pixel, the first color sub-pixel comprises a first color electron blocking layer and a first color light emitting layer, the second color sub-pixel comprises a second color electron blocking layer and a second color light emitting layer, and the third color sub-pixel comprises a third color electron blocking layer and a third color light emitting layer.

15. The manufacturing method of claim 12, wherein a surface of the light coupling layer facing away from the substrate is formed as a curved surface, and the curved surface has a constant curvature.

* * * * *